(12) United States Patent
Chien (10) Patent No.: US 10,557,871 B2
(45) Date of Patent: Feb. 11, 2020

(54) REEL DEVICE

(71) Applicant: PEACEFUL THRIVING ENTERPRISE CO., LTD., Changhua County (TW)

(72) Inventor: Shih-Hsiang Chien, Changhua County (TW)

(73) Assignee: PEACEFUL THRIVING ENTERPRISE CO., LTD., Changhua County (TW)

( * ) Notice: Subject to any disclaimer, the term of this patent is extended or adjusted under 35 U.S.C. 154(b) by 59 days.

(21) Appl. No.: 15/627,403

(22) Filed: Jun. 19, 2017

(65) Prior Publication Data

US 2018/0003740 A1 Jan. 4, 2018

Related U.S. Application Data

(60) Provisional application No. 62/357,389, filed on Jul. 1, 2016.

(51) Int. Cl.

| G01R 15/00 | (2006.01) |
|---|---|
| B65H 75/14 | (2006.01) |
| G01R 19/00 | (2006.01) |
| G01R 23/02 | (2006.01) |
| G01R 27/02 | (2006.01) |

(52) U.S. Cl.
CPC ........... *G01R 15/00* (2013.01); *B65H 75/141* (2013.01); *B65H 2701/36* (2013.01); *G01R 19/00* (2013.01); *G01R 23/02* (2013.01); *G01R 27/02* (2013.01)

(58) Field of Classification Search
CPC ........ G01R 15/00; G01R 27/02; G01R 23/02; G01R 19/00; B65H 75/406; B65H 75/4471; B65H 75/141; B65H 2701/536; B65H 2701/34; B65H 2701/36
See application file for complete search history.

(56) References Cited

U.S. PATENT DOCUMENTS

| 6,400,133 B1 * | 6/2002 | Vest ........................ | H01R 13/72 |
|---|---|---|---|
| | | | 242/400 |
| 6,803,525 B1 * | 10/2004 | Liao ........................ | H02G 11/02 |
| | | | 174/117 F |
| 2006/0028198 A1 * | 2/2006 | Hoopengarner ....... | G01R 11/04 |
| | | | 324/157 |
| 2011/0108654 A1 * | 5/2011 | Babb .................... | B65H 75/364 |
| | | | 242/400 |

OTHER PUBLICATIONS

Elliott, The Basics of Digital Multimeters, 2010, available at https://idealind.com/content/dam/electrical/assets/TestMeasurement/Multimeters/basics-of-digital-multimeters.pdf.*

* cited by examiner

*Primary Examiner* — Daniel R Miller
(74) *Attorney, Agent, or Firm* — Raymond Y. Chan; David and Raymond Patent Firm (57) ABSTRACT

A reel device is a casing device for rollingly storing wire. The casing has a turnplate and is coupled with a measuring model. The measuring model has a function of testing the external circuit or power source plug and providing warning or presenting information regarding the external circuit or power source plug.

4 Claims, 8 Drawing Sheets

REEL DEVICE

CROSS REFERENCE OF RELATED APPLICATION

This is a non-provisional application that claims the benefit of priority under 35U.S.C. § 120 to a provisional application, application No. 62/357,389, filed Jul. 1, 2016. The afore-mentioned provisional application is hereby incorporated by reference in its entirety.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention is a rollingly storage device to accommodate regular wire with terminal. The device comprises a measuring model to detect electric information. More specifically, the measuring model is to measure the volume and information of multiple circuits or to detect if the circuit(s) function normally and to display the obtained information.

Description of Related Arts

Common reel devices only have a single function of accommodating wire. Regular measuring models only have a single function of detecting.

What is so called measuring model is a device for testing household or commercial power source or circuit and knowing the information regarding if the circuit functions normally. it obtains the information through the circuit connected and utilizes its preset indicator lights to present the information.

Another measuring model has a sounding device that it can utilizes the sounding device to present the obtained information to warn the user.

Another measuring model has a display screen that it can utilizes the display screen to present and signal the obtained information.

The reel device here indicates a casing with a turnplate that it allows a wire to be rollingly stored in the casing by means of the turnplate and that the wire can be pulled out by the user from the casing to be utilized to connect circuit or to be plugged into a power source.

Generally, if the target power source or circuit being tested is relatively far from the test equipment and hard to be moved, the user will need a set of extension cord to connect the test equipment and to elongate its measurable range. Then a reel device is also required. Therefore, the user will have to separately obtain and carry these two tools.

The present inventor would like to reduce the size and load of the package of the user and take off the additional extension cord set, so invented the reel device that has a measuring model coupled and located thereon, so as to allow the reel device to detect and measure a plurality of external circuit breakers or to control specific power plug(s). The obtained electric information is provided to the measuring model to process, so as to illustrate the information of the processed current, capacitance, voltage, resistance, and frequency. Accordingly, the device achieves the objects of being portable and having multiple detection functions.

SUMMARY OF THE PRESENT INVENTION

The reel device is a casing for storing wire. The casing comprises a cover and a pad arranged thereon. The assembled cover, casing, and pad can pivot, so that the casing can roll back or pull out winded and extended wire for use. Besides, an end of the wire has a terminal arranged thereon. The terminal is exposed on the casing as a plug to contact a circuit or connect a power source. The terminal comprises a pair or more input terminal.

There is also a measuring model coupled with an end face of the casing. The circuit of the measuring model comprises a current testing circuit, a voltage testing circuit, a resistance testing circuit, a capacitance testing circuit, and a frequency testing circuit to detect the function of an external circuit or power source. There is also a display panel arranged on the measuring model. The displaying side of the display panel is a surface appeared on the measuring model that the display panel can utilize it to present indications or to show information.

The terminal arranged on an end of the wire comprises a pair of input terminals as guiding terminals for external power connection. Accordingly, the pair of input terminals can be inserted into the measuring model or connected with an external circuit or power source, so as to receive electronic messaging input and utilize the measuring model to verify information and to display the information regarding the electronic messaging or to deliver warning indications.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

In order for full understanding of the present invention, the following provides preferred embodiment(s) with drawings as a detail description. Further descriptions of preferred embodiment(s) with drawings may allow person skilled in the art to be able to implement the present invention based on the descriptions in the present specification, but the descriptions are not to limit the scope of the present invention (incorporation by reference).

Figure 1:
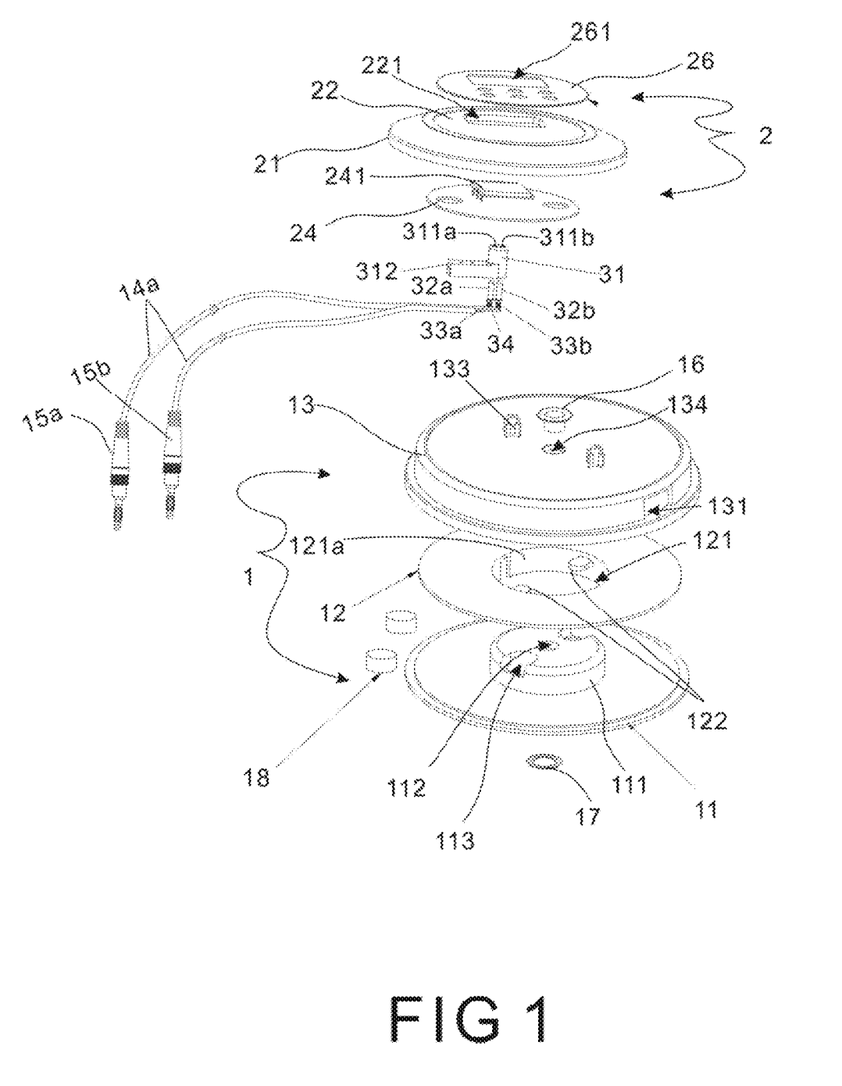
FIG. 1 is an exploded view according to the present invention.
Figure 2:
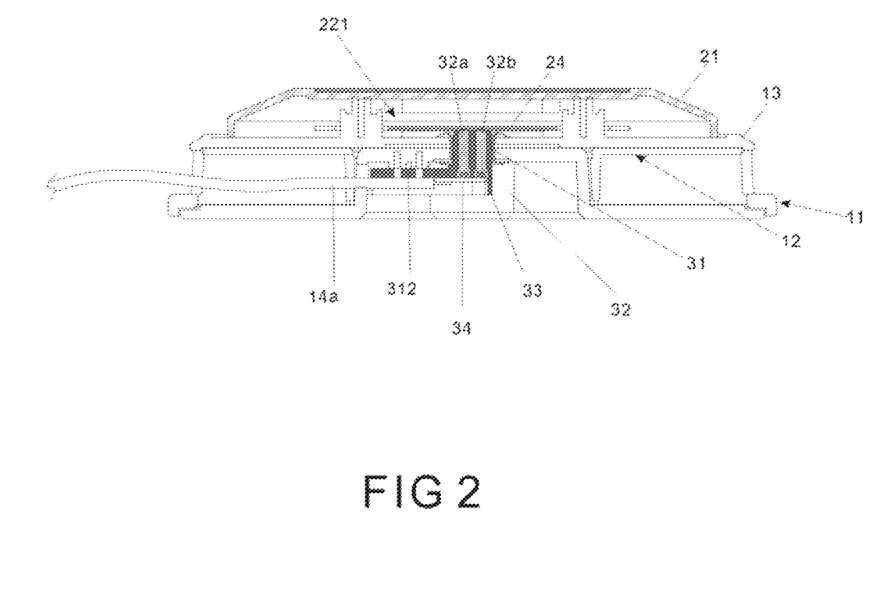
FIG. 2 is a sectional view according to the present invention.
Figure 3:
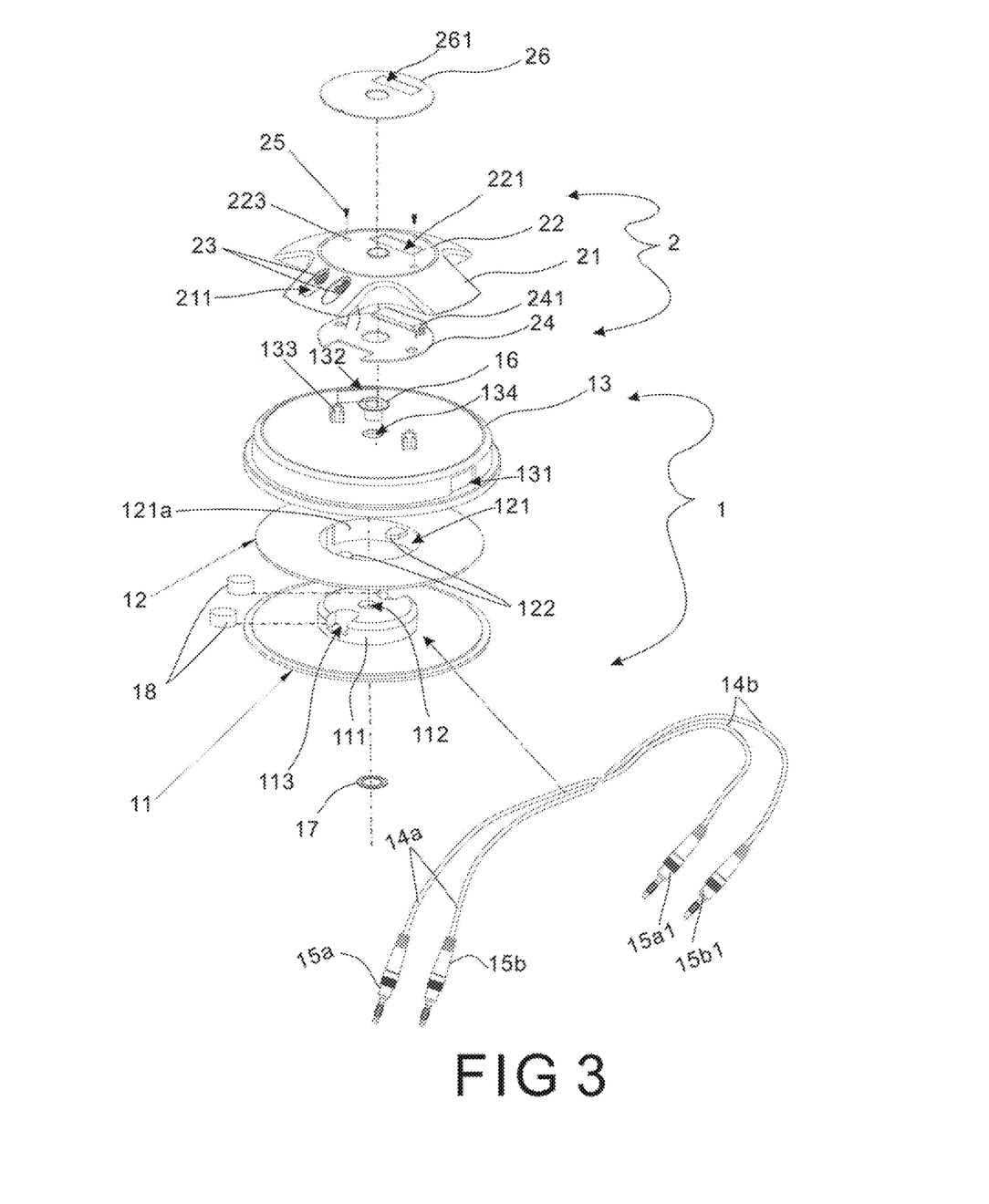
FIG. 3 is an exploded view according to another embodiment of the present invention.
Figure 4:
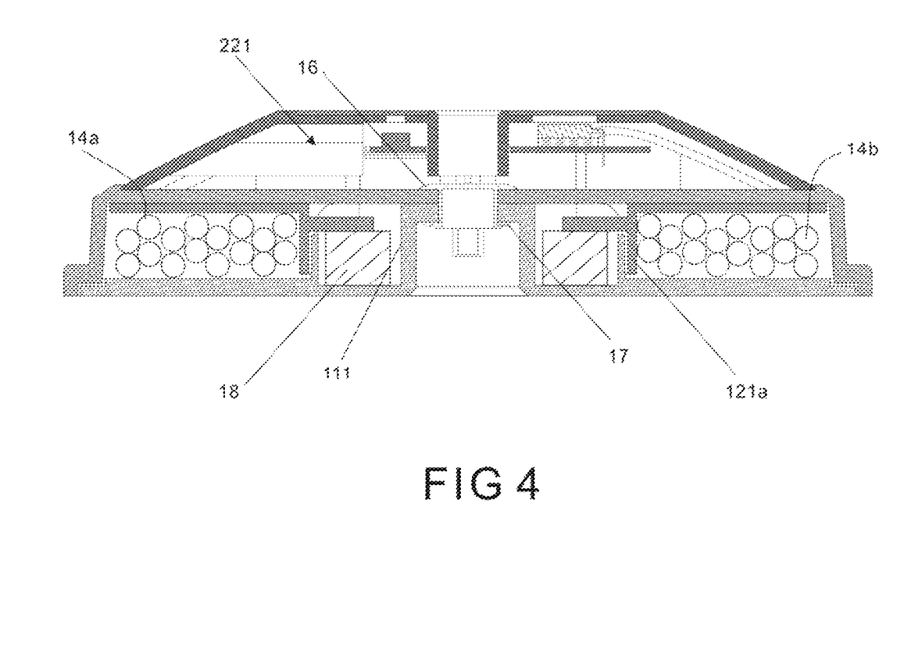
FIG. 4 is a sectional view of the assembly of FIG. 3.

Referring to FIGS. 1-2, the reel device comprises a casing 1, a measuring model 2 coupled with the casing 1, a affixing portion 31, a first metal column 32a and a second metal column 32b, a first spring 33a and a second spring 33b, and a contact portion 34. The casing 1 comprising a first cover 11 and a second cover 13 arranged thereon and a pad 12 clampingly held between the first cover 11 and the second cover 13. The first cover 11 has a protruding portion 111, a assembling hole 112 on the center of the protruding portion 111, and a pair of recess 113 arranged on the edge of the protruding portion 111. The second cover 13 has a first outlet 131 and a through hole 134 arranged at the center thereof. The pad 12 has a sleeving portion 121. The bore side of the sleeving portion 121 has a enclosure 121a arranged thereon. The enclosure 121a has a pair of pressing boards 122 arranged thereon. An end face of the casing 1 is coupled with a measuring model 2. The measuring model 2 comprises a measuring circuit 24. The affixing portion 31 is rod shaped and provides a circuit to connect with the measuring circuit 24. The affixing portion 31 has a first hole 311a and a second hole 311b both arranged thereon. An end of the affixing portion 31 extends to form a locating slot 312. The first spring 33a and the second spring 33b are respectively arranged on a bottom end of the first metal column 32a. The contact portion 34 is a electrical conductor. The contact portion 34 is connected with a pair of wires 14a. The end portions of the pair of wires respectively have a first input terminal 15a and a second input terminal 15b arranged and connected thereon. A shell 21 has a surface 22. The surface 22 has a window 221 arranged thereon as a locating and accommodating area of the display panel 241. The display panel 241 is allowed to present information out through the window 221. There is a nameplate 26 attached on the surface 22. The nameplate 26 has an opening 261 arranged thereon that matches the display panel 241.

The assembly structure of the casing 1 is as the following. The casing 1 storages a pair of extended wires 14a. The extended wires 14a are rollingly stored in the casing 1 through winding. An end of the pair of wires 14a are respectively revealed from the first outlet 131 and can be pulled out from the casing 1. An end of the extended wires 14a comprise a first input terminal 15a and a second input terminal 15b respectively. Referring to FIG. 2, the top ends of the first metal column 32a and the second metal column 32b are respectively passed through the affixing portion 31 and limited in the first hole 311a and the second hole 311b arranged thereon. The contact portion 34 pushes against the first spring 33a and the second spring 33b. The front ends of the pair of wires 14a are placed and located in the locating slot 312. The column of the affixing portion 31 is sleevingly assembled in the through hole 134 of the second cover 13. The measuring circuit 24 is pressed and arranged at the affixing portion 31 to be connected with the circuit for receiving information through the first metal column 32a and the second metal column 32b that contact the measuring circuit 24. The measuring circuit 24 is covered by a shell 21.

The shell 21 comprises an assembling area 221 for placing and locating the measuring circuit 24. The sleeving portion 121 of the pad 12 matches the protruding portion 111 of the first cover 11. The enclosure 121a surrounds the protruding portion 111. The pair of recesses 113 have a magnet 18 arranged therein respectively. The pair of pressing board 122 matches the pair of recesses 113. The pressing boards 122 locate the magnets 18 in the recesses 113, so as to prevent the magnets 18 from separating from the recesses 113. The through hole 134 of the second cover 13 matches the assembling hole 112 of the first cover 11. A rivet 16 fits the through hole 134 and the assembling hole 112 is put therein and riveted on a spacer 17, so that the first cover 11 can pivot and rotate on the second cover 13. Specifically speaking, the rivet 16 serves the function of an axle and the pad 12 serves the function of limiting the wires 14a on the first cover 11. Besides, the first input terminal 15a and the second input terminal 15b serve the function of power plug to couple with external power source or obtain external circuit information. The obtained circuit information will be transmitted to the first metal column 32a and the second metal column 32b through the wires 14a and then to the measuring circuit 24 through the first metal column 32a and the second metal column 32b. After the measuring circuit 24 processed the information into data, the display panel 241 will be utilized to illustrate the data.

Figure 7:
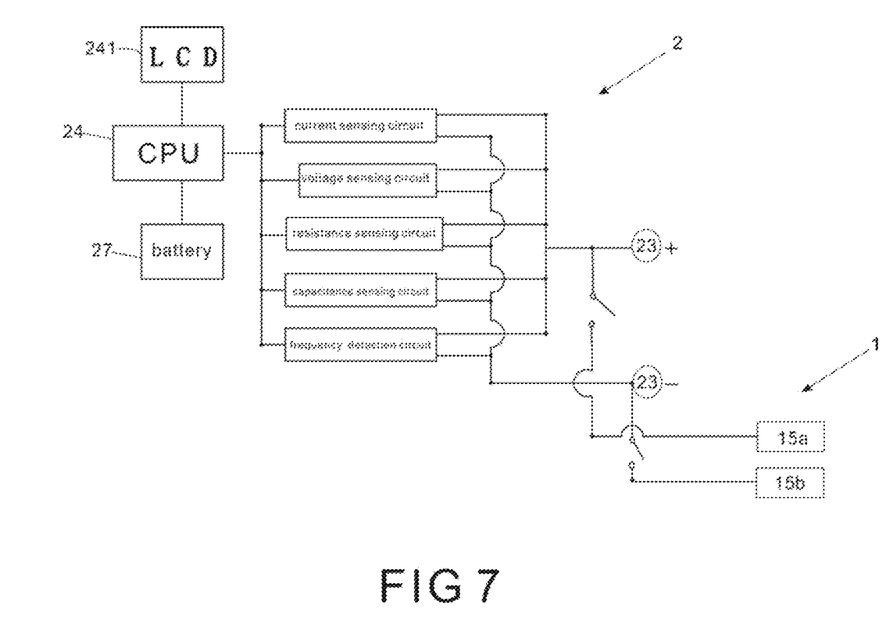
FIG. 7 illustrates a perspective circuit of FIG. 1.

The processing flow of the circuit of the above mentioned measuring model 2 is illustrated in FIG. 7. The measuring model 2 comprises a measuring circuit 24, a display panel 241, and a battery 27. The measuring circuit 24 can process information from current testing circuit, voltage testing circuit, resistance testing circuit, capacitance testing circuit, and frequency testing circuit. The measuring circuit 24 has a microprocessor to process information. The external electric information obtained through the first input terminal 15a and the second input terminal 15b are transmitted to the first metal column 32a and the second metal column 32b through the wires 14a and then to the measuring circuit 24 through the first metal column 32a and the second metal column 32b. The measuring circuit 24 processes each detected circuit information. Then the measuring circuit 24 sends the processed data to display panel 241 to present the data. The switch on the nameplate 26 can switch from the functions, comprising switching the first metal column 32a and the second metal column 32b from the testing circuit to the electricity transmission. Accordingly the first input terminal 15a and the second input terminal 15b will transmit external electric power through the wires 14a to the first metal column 32a and the second metal column 32b to send it to other device connected with the first metal column 32a and the second metal column.

Furthermore, FIGS. 3-6 illustrate another embodiment, where the measuring circuit 24 comprises a display panel 241 arranged thereon. The display panel 241 can deliver indications or present information. The circuit of the metal slot 23 is connected to the measuring circuit 24 for coupling with external power plug for receiving electric power or detecting external circuit information.

The measuring circuit 24 and the metal slot 23 are covered by a shell 21. The shell 21 has an assembling area 211 arranged thereon for arranging and locating the metal slot 23. The shell 21 has a surface 22. The surface 22 has a window 221 arranged thereon as an accommodating area to locate the display panel 241. The display panel 241 can only present information outward through the window 221. There is a nameplate 26 attached on the surface 22. The nameplate 26 has an opening 261 for the display panel 241 to be matchingly arranged.

Next, the assembly structure of the casing 1 is as follows. The casing 1 accommodates two pairs of extended wires 14a and 14b. The extended wires 14a and 14b are respectively rollingly stored in the casing by winding. An end of the extended wires 14a have both a first input terminal 15a and a second input terminal 15b. An end of the extended wires 14b have both a first input terminal 15a1 and a fourth input terminal 15b1. The sleeving portion 121 of the pad 12 matches the protruding portion 111 of the first cover 11. The enclosure 121a surrounds the protruding portion 111. The pair of recesses 113 have a magnet 18 put in respectively. The pair of pressing boards 122 match the pair of recesses 113. The pressing boards 122 locate the magnets 18 in the recesses 113, so as to prevent them from leaving the recesses 113. The through hole 134 of the second cover 13 matches the assembling hole 112 of the first cover 11 and a rivet 16 fits the through hole 134 and the assembling hole 112 so as to put therein and to be riveted on a spacer 17, such that the first cover 11 can pivot or pivotally rotate on the second cover 13. Specifically speaking, the rivet 16 serves the function of an axle and the pad 12 serves the function of limiting the wires 14a and 14b on the first cover 11.

Besides, the pair of wires 14a and another pair of wires 14b are exposed on the casing 1 from the first outlet 131 and second outlet 132 respectively. The wires 14a and wires 14b can be pulled out to be exposed from the casing 1. Accordingly, the first input terminal 15a and the second input terminal 15b and the third input terminal 15a1 and the fourth input terminal 15b1 are protrudingly exposed outside the first outlet 131 and the second outlet 132. The first input terminal 15a and the second input terminal 15b serve the function of power plugs of coupling with the external power source or receiving electronic test information. The third input terminal 15a1 and the fourth input terminal 15b1 allow coupling to the metal slots 23, so as to transmit the tested external circuit information to the measuring model 2 to process the circuit information into data.

In addition, the shell 21 of the measuring model 2 has a pair of holes 223 arranged thereon. The holes 223 match the assembling columns 133 of the second cover 13. A screw 25 fits the hole 223 to be screwed and located on the assembling column 133, so as to couple and locate the measuring model 2 on the casing 1.

The first cover 11 is able to pivotally rotate on the second cover 13. The wires 14a and the wires 14b can be rolled and rollingly stored in the casing 1 through this pivoting action. The pair of wires 14a and the pair of wires 14b can be pulled out from or rolled back into the casing 1.

Figure 5:
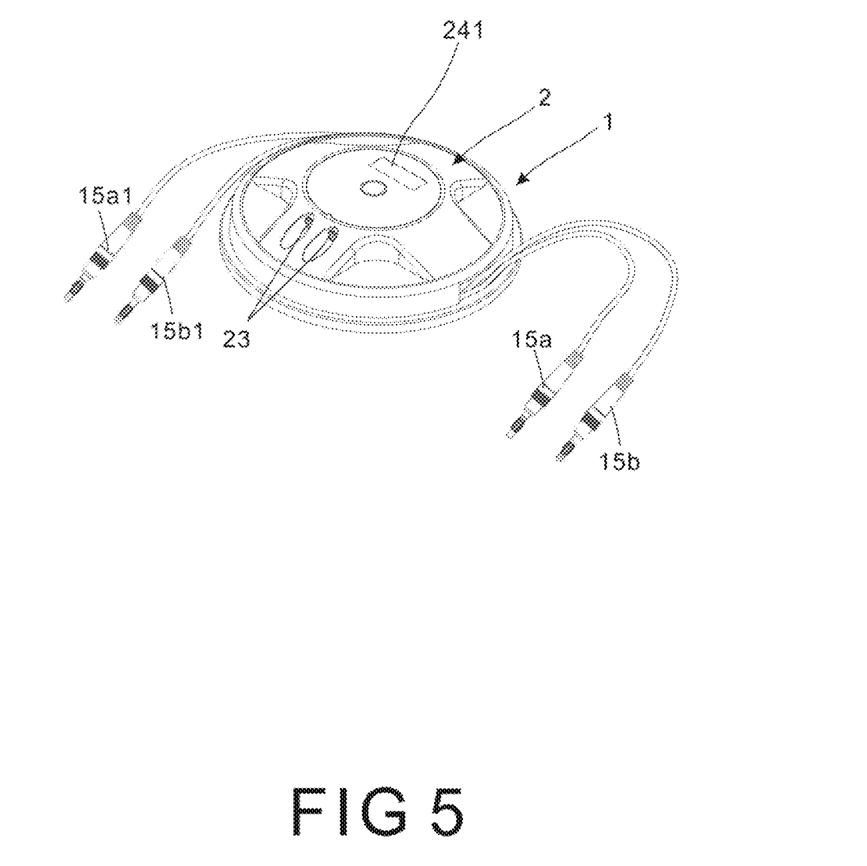
FIG. 5 is an assembly of FIG. 3.
Figure 6:
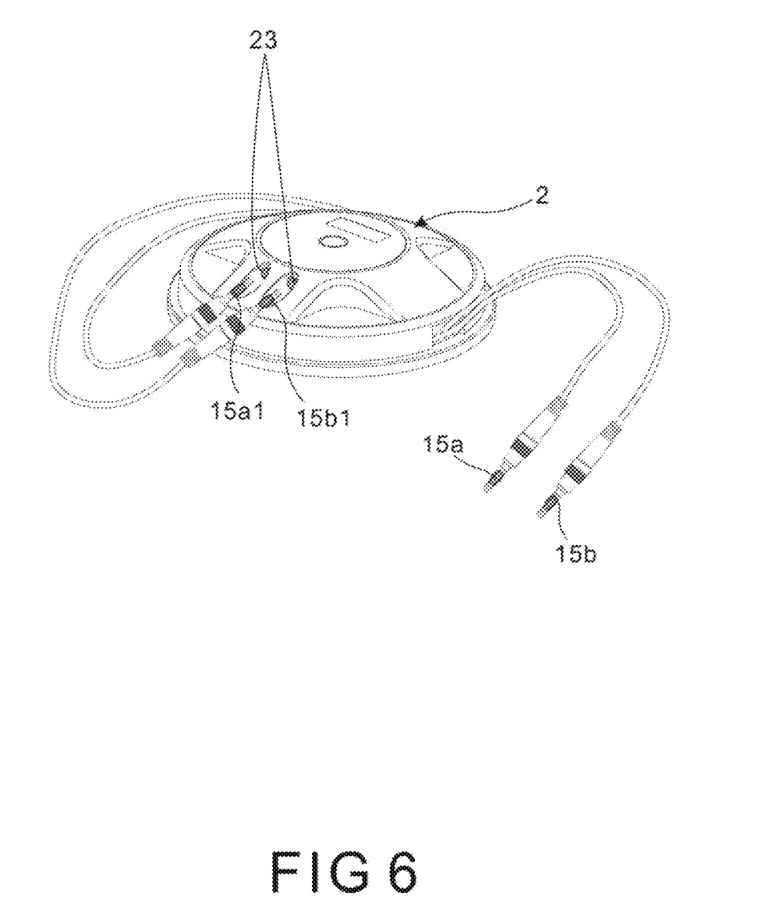
FIG. 6 is an implementation of FIG. 3.

Referring to FIG. 5, the first input terminal 15a and the second output terminal 15b of the pair of wires 14a are respectively a positive terminal and a negative terminal for transmitting external electric power or detected electric information to another pair of wires 14b. Then after the third input terminal 15a1 and the fourth input terminal 15b1 are plugged into the metal slots 23, the circuit information detected from the external circuit via the first input terminal 15a and the second output terminal 15b will be output to the measuring circuit 24. Accordingly, the measuring circuit 24 can process and verify the information, send out warning signal, or convert the information into data and provide the signal or data to the display panel 241 for presenting.

Figure 8:
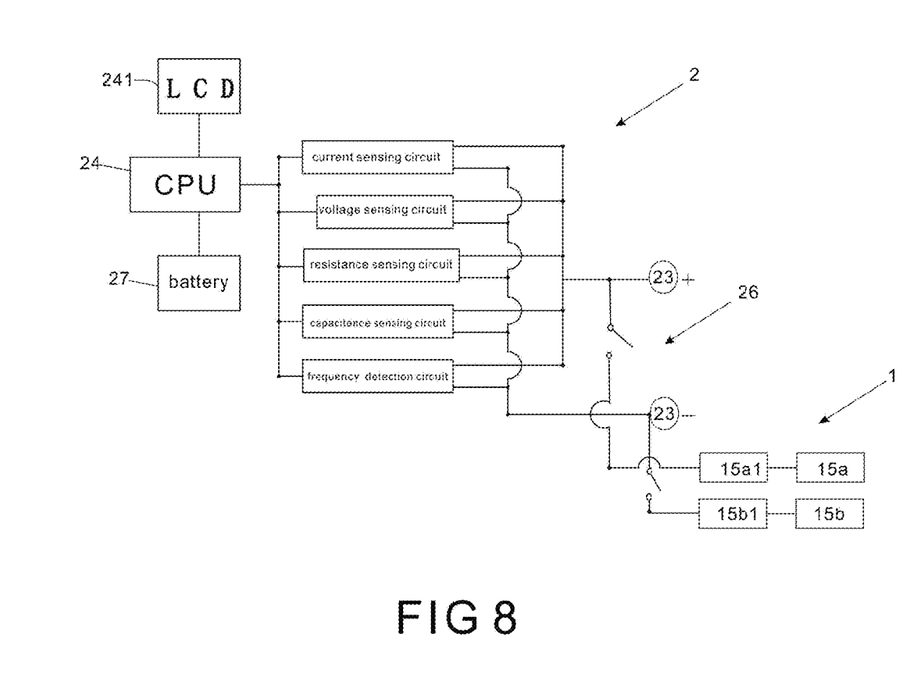
FIG. 8 illustrates a perspective circuit of FIG. 3.

The processing flow of the circuit of the above mentioned measuring model 2 is illustrated in FIG. 8. The measuring model 2 comprises a measuring circuit 24, a display panel 241, and a battery 27. The measuring circuit 24 can process information from current testing circuit, voltage testing circuit, resistance testing circuit, capacitance testing circuit, and frequency testing circuit. The electric information obtained via the first input terminal 15a and the second input terminal 15b are transmitted to the third input terminal 15a1 and the fourth input terminal 15b1. After the third input terminal 15a1 and the fourth input terminal 15b1 are plugged into the metal slots 23, the electric information will be sent to the measuring circuit 24 through the metal slots 23. Then the measuring circuit 24 will process the circuit information, convert it into data, and send data to the display panel 241 to present the data. The switch on the nameplate 26 can switch from the functions, comprising switching the metal slots 23 from the testing circuit to electricity transmission. Accordingly, the third input terminal 15a and the second input terminal 15b will transmit external electric power. Then the power will be transmitted through the third input terminal 15a1 and the fourth input terminal 15b1 or through the metal slots 23 to other device connected with the third input terminal 15a1 and the fourth input terminal 15b1 or with the metal slots 23.

The above mentioned wires 14a and wires 14b can respectively be one pair or more. The first input terminal 15a, the second input terminal 15b, the third input terminal 15a1, and the fourth output terminal 15b1 can respectively be one pair or more, too.

The measuring model 2 can have wireless transmitting device arranged therein, such that the circuit information measured through the first input terminal 15a and the second input terminal 15b can be wirelessly transmitted to the display panel for showing. Also, it can utilize the wireless transmitting device to send the information to a handheld communication device, so as to employees the handheld communication device to conduct further data processing, utilizing, and presenting.

An advantage of utilizing the above mentioned assembly is that the input or output terminal can use the reel to extend and form a connection to power source or become an extended wire that does not have to be externally connected to a set of plugs of an extension cord. Besides, it can utilize the input or output terminal to directly serve as a detection port or insertion port.

All in all, the above is only a preferred embodiment of the present invention, which is not to limit the scope of the implementation of the present invention. All equivalent varieties and modifications based on the appended claims of the present invention are within the scope of the present invention.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A reel device, comprising:
    a casing comprising a first cover, a second cover and a pad clampingly held between said first cover and said second cover, wherein said first cover has a protruding portion that has an assembling hole on a center thereof and a pair of recesses on an edge thereof, wherein said second cover provides a first outlet and a second outlet thereon and has a through hole at a central position thereof and a pair of assembling columns that are equally high, wherein said pad has a sleeving portion that has an enclosure arranged on a bore side thereof, wherein said enclosure has a pair of pressing boards arranged thereon; and a measuring model, coupled on an end face of said casing, wherein said measuring model comprises:

a shell, mounted on said second cover, wherein said shell has a display panel mounted thereon;

a measuring circuit, arranged in said shell;

an affixing portion that is rod shaped and provides a circuit for connecting with said measuring circuit;

a first metal column and a second metal column arranged on said affixing portion, wherein top ends of said first metal column and said second metal column penetrate said affixing portion and contact said measuring circuit, wherein a first spring and a second spring are respectively arranged on a bottom end of said first metal column; and a contact portion that is an electrical conductor, having an end connected with a pair of wires, wherein end portions of said pair of wires respectively provide a first input terminal and a second input terminal arranged thereon, wherein bottom ends of said first spring and said second spring are propped against said contact portion, wherein a circuit of said measuring circuit is connected to said display panel.

2. A reel device, comprising:

a casing that is a pivot device for pivotally rotating;

a pair of wires rolled around within said casing and allowed to be pulled out by pivotally rotating said casing, wherein said wires provide a pair of input terminals on an end thereof respectively, wherein said pair of input terminals are respectively positive terminal and negative terminal; and a measuring model coupled on said casing, wherein said measuring model comprises a measuring circuit and a display panel connected with said measuring circuit, wherein said measuring circuit processes electronic information comprising a current testing circuit, a voltage testing circuit, a resistance testing circuit, a capacitance testing circuit, and a frequency testing circuit, wherein said wires are connected with said measuring circuit, wherein said display panel receives an information processed by said measuring circuit, wherein a quantity of said pair of wires is one set or more, wherein each of said pair of wires has an input terminal, wherein an end face of said measuring model has a pair of metal slots arranged thereon, wherein a circuit of each of said pair of metal slots is connected with said measuring circuit, wherein said pair of input terminals is inserted to receive an external electric information and another said pair of input terminals is connected with said metal slots, so as to transmit an electronic information to said measuring circuit, wherein said measuring model further comprises a switch that switches said metal slots from function of testing electricity to function of electricity transmission in which said pair of input terminals coupled to an external power source.

3. The reel device, as recited in claim 2, wherein said pair of metal slots is one set or more sets of metal slots.

4. A reel device, comprising:

a casing having a pivot device for pivoting and comprising at least a set of wires, wherein said wires are winded to be rollingly stored in said casing and allowed being pulled out through pivoting said casing, wherein an end of each of said wires has a terminal which comprises at least a set of input terminal, wherein an end face of said casing has a display panel arranged thereon; and a measuring model coupled on said casing, wherein said measuring model comprises a measuring circuit, wherein said measuring circuit processes information and comprises a current testing circuit, a voltage testing circuit, a resistance testing circuit, a capacitance testing circuit, and a frequency testing circuit, wherein said measuring circuit is connected with said display panel, wherein said set of input terminal comprises positive and negative terminals, wherein said measuring model further comprises a switch which switches between a first function for coupling said positive and negative terminals to an external power source for electricity transmission and a second function for coupling an external circuit to said measuring circuit through said positive and negative terminals.

\* \* \* \* \*